United States Patent [19]

Hoffman

[11] 3,970,951

[45] July 20, 1976

[54] DIFFERENTIAL AMPLIFIER WITH CONSTANT GAIN

[75] Inventor: Charles Reeves Hoffman, Raleigh, N.C.

[73] Assignee: International Business Machines Corporation, Armonk, N.Y.

[22] Filed: Nov. 12, 1975

[21] Appl. No.: 631,353

[52] U.S. Cl. .............................. 330/30 D; 307/304; 330/22; 330/35
[51] Int. Cl.² .......................................... H03F 3/16
[58] Field of Search ............ 307/304; 330/22, 30 D, 330/35, 29

[56] References Cited
UNITED STATES PATENTS

| | | | |
|---|---|---|---|
| 3,700,981 | 10/1972 | Masuhara et al. | 330/35 X |
| 3,832,644 | 8/1974 | Nagata et al. | 330/22 |

Primary Examiner—R. V. Rolinec
Assistant Examiner—Lawrence J. Dahl
Attorney, Agent, or Firm—Delbert C. Thomas

[57] ABSTRACT

The subject of this invention is a differential amplifier circuit having a constant gain characteristic over a range of input voltage and suitable for use in integrated circuits in semi-conductor chips. The circuit is embodied in the enhanced-depleted field effect transistor technology and includes a pair of parallel circuits. Each circuit has a depletion type of field effect transistor (FET) connected to the drain voltage source, and its source connected to the drains of two enhanced FET's and to the gate of the one of these which has its source to a ground level. The other enhanced FET's have their sources connected together and to a constant current source. One gate of these other FET's is connected to the reference voltage and the other to an input voltage to be amplified. By a proper selection of FET design parameters, the amplifier gain can be constant over the full operating range of the input voltage.

4 Claims, 3 Drawing Figures

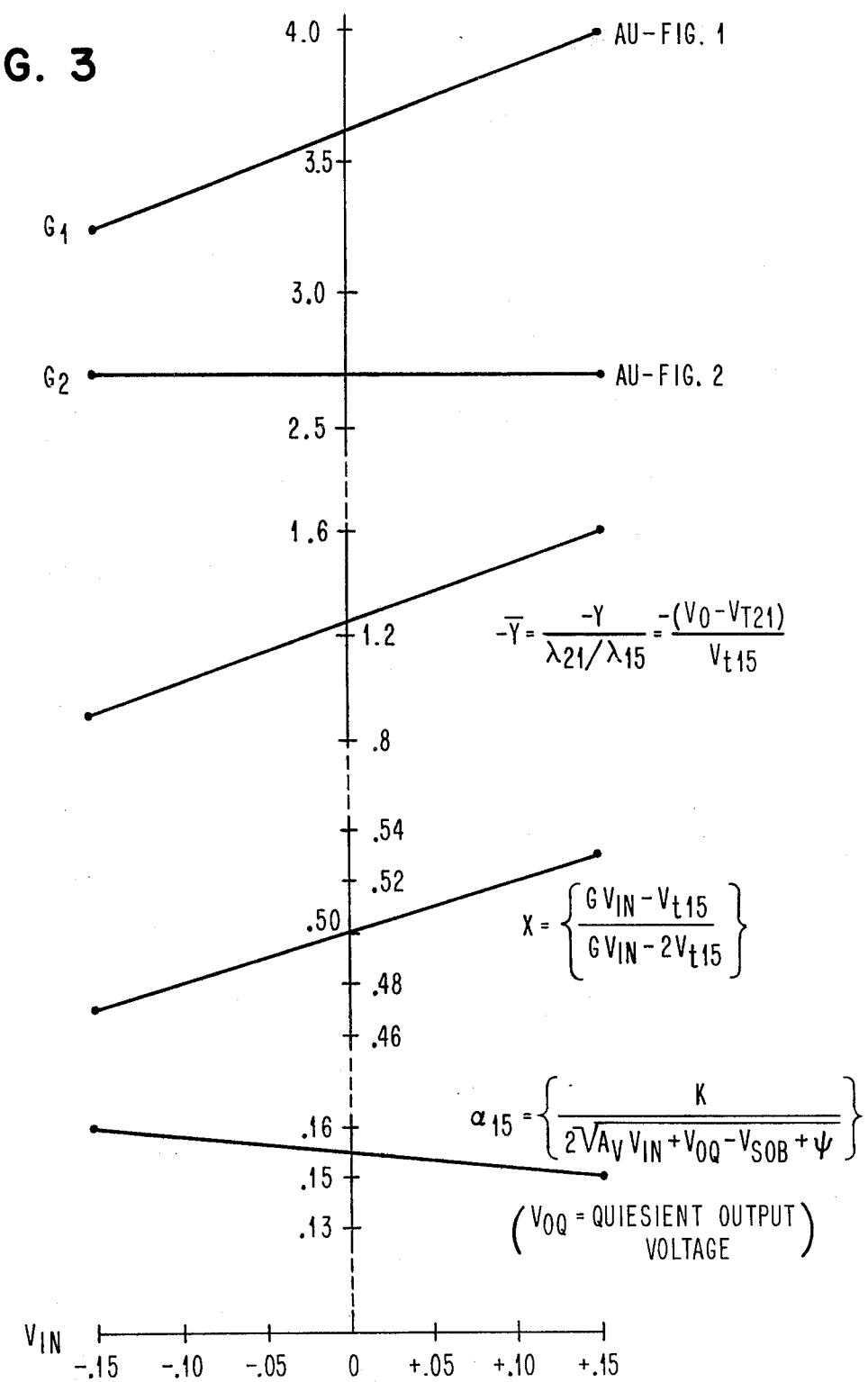

DIFFERENTIAL AMPLIFIER WITH CONSTANT GAIN

Differential amplifiers using field effect transistors (FET's) in a depletion-enhancement type of transistor technology have been known and used for the amplification of analog signals. However, such known amplifiers have not been suitable for precision or linear amplification since the amplification factor of the circuit changes as the input signal voltage varies. Consequently, the output is not a true amplified copy of the input and cannot be used for measurement or control purposes without some compensating circuits.

It is then an object of this invention to devise a circuit of the FET type which will provide a constant amplification factor over an operating range of input signal voltages.

It is also an object to provide such an amplifier circuit which can be incorporated on a semi-conductor chip with other active circuitry.

A further object is to provide a linear circuit of the differential amplifier type which can be incorporated on a semi-conductor chip with other circuits and which will provide a uniform gain characteristic for input signals.

Other objects will be apparent in the following description of appended drawings showing a preferred embodiment of the circuit of my invention and in the claims which follow.

BRIEF DESCRIPTION OF THE DRAWINGS

FIG. 3 is a composite chart showing the effect of the parameters to be considered in the design of a circuit as in FIG. 2.

Differential amplifiers can be used for amplification of low level analog type signals and provide a relatively satisfactory circuit. However, the differential amplifier when constructed in the enhanced-depleted transistor logic type of circuits on a semi-conductive chip does not maintain a constant relation between the input and output voltage signals and has not been appropriate in applications where linearity is essential for measurement or control purposes.

Figure 1:
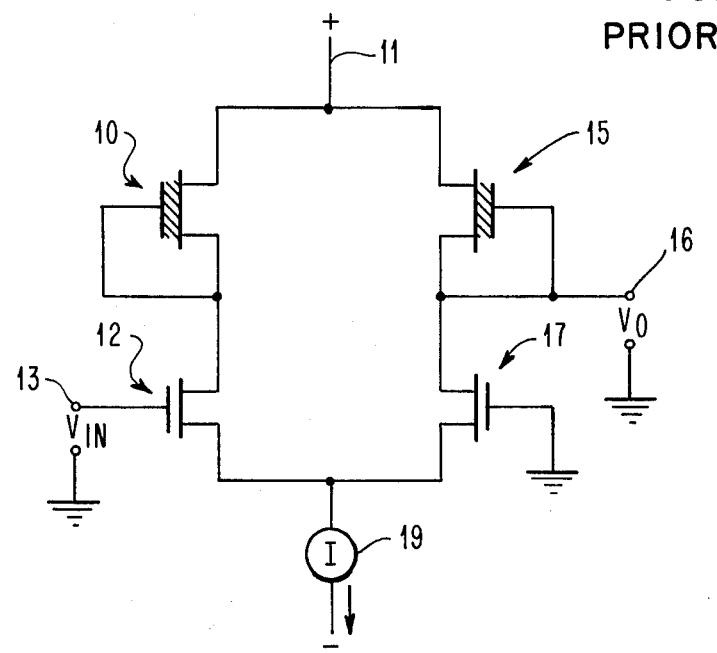
FIG. 1 is a circuit diagram of the prior art differential amplifier.

In FIG. 1, a differential amplifier circuit of a known type is shown. The circuit is conventionally fabricated on a chip having its substrate connected to a negative voltage supply to provide isolation of the circuit elements and will comprise both enhanced and depleted technology transistors. An enhanced FET has the characteristic that it will not normally conduct a current and a positive gate voltage with respect to its source is required to cause conduction whereas the depleted type FET is normally conductive and is rendered non-conductive by a gate voltage which is negative with respect to its source.

In FIG. 1, a depleted FET 10 has its drain connected to a terminal 11 of a drain voltage source and its gate and source electrodes are connected to the drain of an enhancement type FET 12. The gate of FET 12 is connected to a terminal 13 to receive a voltage $V_{in}$ to be amplified. A second depletion FET 15 has its drain connected to voltage source 11 and its source and gate are connected to a terminal 16 where the amplified output of the circuit is available. The output terminal 16 is also connected to the drain of a second enhanced FET 17 having its gate connected to a zero reference voltage, i.e., a ground level. The sources of both FET's 12 and 17 are connected together and are supplied current by a current source 19. Current source 19 may be any substantially constant current device such as a saturated transistor or a more complex circuit.

The uppermost curve $G_1$ of the chart of FIG. 3 indicates a representative variation of the input voltage to output gain of the FIG. 1 circuit over the operating range +0.15V to −0.15V of the input voltage. It is evident that the gain varies over this range so that the amplitude of an output signal will depend upon the average level of the input signal and that the positive and negative excursions of the output will not have the same amplitude relation as in the input signal.

Figure 2:
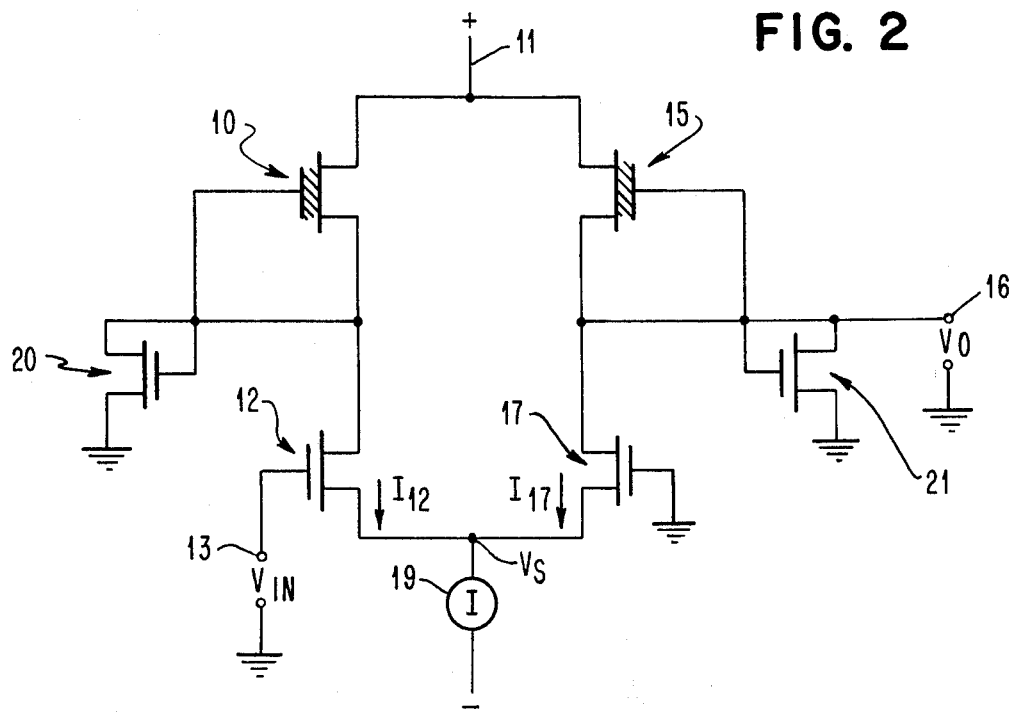
FIG. 2 is a circuit diagram of the circuit of the preferred embodiment of my invention.

The circuit of FIG. 2 is a modified version of that of FIG. 1 and has a uniform though slightly lower gain characteristic. In this circuit, the FET's 10, 12, 15 and 17 are retained in the same configuration with current source 19, input 13 and output 16 as in FIG. 1. An additional enhancement FET 20 is provided with both its drain and its gate connected to the junction of transistors 10 and 12 and a second additional enhancement FET 21 is similarly connected to the output junction 16. The sources of FET's 20 and 21 are each connected to the reference or ground level. These additional transistors modify the reaction of the circuits to voltage variations so that the gain is non-uniformly reduced as shown by graph $G_2$ of FIG. 3. It may be seen that the resulting gain does not change to any appreciable extent over the usable range of input signal voltages.

By operating the FET devices in the saturation region (i.e., $V_{DS} > V_{GS} - V_T$) the terminal voltage - current relationship is given by $$I_{DS} = C\mu \left(\frac{W}{L}\right)(V_{GS} - V_T)^2$$

where
$V_{DS}$ = Drain to source voltage
$V_{GS}$ = Gate to source voltage
$C$ = Gate capacitance per unit area
$\mu$ = Effective carrier mobility
$W/L$ = channel width to length ratio Using this equation, it can be shown that the basic differential amplifier of FIG. 1 has a gain characteristic $Av$ given by $$Av = \frac{\delta V_{out}}{\delta V_{in}} = \frac{G}{2\alpha}\left\{\frac{2GV_{in} - 2V_{t15}}{GV_{in} - 2V_{t15}}\right\}$$

where $$G = \left(\frac{\lambda A}{\lambda L}\right)^{1/2} = \left\{\frac{(C\mu)_A (W/L)_A}{(C\mu)_L (W/L)_L}\right\}^{1/2}$$

in which the A subscript refers to FETs 12 and 17 the L subscript refers to FETs 10 and 15

$$\alpha = 0.5K(V_o - V_{sub} + \psi)^{-1/2}$$

$V_{t15}$ is the threshold turn-on voltage of FET 15
$$V_{t15} = K_1 + K(V_o - V_{sub} + \psi)^{1/2} = K_1 + K^2/2\alpha$$

K and $K_1$ are process dependent parameters,
$V_o$ is the output voltage signal (source voltage of FET 15)
$V_{sub}$ is the substrate to ground voltage and
$\psi$ is two times the Fermi level.

The following specific values of these parameters were used to generate curve $G_1$ of FIG. 3.

$\lambda A = 27/2 \ (5.2) = 70.2 \ \mu V/V$
$\lambda L = 27/2 \ (4.28) = 57.8 \ \mu V/V$ $\psi = 0.75V$
$K_1 \text{ (Enhanced)} = -0.84V$
$K_1 \text{ (Depleted)} = -4.06V$
$K = 0.919V^{1/2}$
$V_{sub} = -5V$
$I = 203\mu A$ The same parameters are used to generate graph $G_2$ for the circuit of FIG. 2 with the additional parameter $\lambda_{20} = \lambda_{21} = 2.16 \mu V/V.$ In order to compute the voltage gain for the circuit of FIG. 2, we can consider it in two parts.

$$Av = \frac{\delta V_o}{\delta V_{in}} = \frac{\delta V_o}{\delta I_{17}} \cdot \frac{\delta I_{17}}{\delta V_{in}}$$

To compute $\delta I_{17}/\delta V_{in}$ $I_{19} = I_{12} + I_{17}$

Identifying the voltage at the common source node of FET's 12 and 17 as $V_s$ $I_{12} = \lambda_A (V_{in} - V_s - V_{TA})^2$
$I_{17} = \lambda_A (-V_s - V_{TA})^2$ Solving for $(-V_s - V_{TA})$ and substituting $I_{12} = \lambda_A (V_{in} + \{I_{17}/\lambda_A\}^{.5})^2$
$I_{19} = \lambda_A (V_{in} + \{I_{17}/\lambda_A\}^{.5})^2 + I_{17}$ $I_{19}$ is constant, and taking a partial derivative with respect to $V_{in}$ $$\frac{\delta I_{17}}{\delta V_{in}} = -2 \ \{I_{17}/\lambda_A\}^{.5} \ \left\{ \frac{V_{in} + (I_{17}/\lambda_A)^{.5}}{V_{in} + 2(I_{17}/\lambda_A)^{.5}} \right\}$$

Next, multiply both numerator and denominator of the term inside braces by $\lambda_A/\lambda_L)^{.5}$ and also multiply the quantity outside braces by $(\lambda_L/\lambda_L)^{.5}$. This gives $$\frac{\delta I_{17}}{\delta V_{in}} = -2 \ (\lambda_A/\lambda_L)^{.5} \cdot (I_{17}\lambda_L)^{.5} \ \left\{ \frac{(\lambda_A/\lambda_L)^{.5} \cdot V_{in} + (I_{17}/\lambda_L)^{.5}}{(\lambda_A/\lambda_L)^{.5} \cdot V_{in} + 2(I_{17}/\lambda_L)^{.5}} \right\}$$

Let $G = (\lambda_A/\lambda_L)^{.5}$ $$\frac{\delta I_{17}}{\delta V_{in}} = -2G \ (I_{17}\lambda_L)^{.5} \ \left\{ \frac{G \cdot V_{in} + (I_{17}/\lambda_L)^{.5}}{G \cdot V_{in} + 2(I_{17}/\lambda_L)^{.5}} \right\}$$

Under the condition that
$I_{17} \approx I_{15} >> I_{21}$
$I_{17} \approx \lambda_L (-V_{t15})^2$
and
$\lambda_L = \frac{1}{2}\mu C \ (W/L)_{15}$ for FET 15
Therefore $-V_{t15} = (I_{17}/\lambda_L)^{.5}$ and $$\frac{\delta I_{17}}{\delta V_{in}} = -2G \ 15 \ \lambda_L V_{t15} \ \left( \frac{G \cdot V_{in} - V_{t15}}{G \cdot V_{in} - 2V_{t15}} \right)$$

To compute $\delta V_o/\delta I_{16}$ start by noting $I_{15} - I_{21} = I_{17}$
$I_{17} = \lambda_{15} \ (-K_1 - K \ \{V_o - V_{sub} + \psi\}^{.5})^2 - \lambda_{21} \ (V_o - V_{T21})^2$ Taking partial derivatives and solving $$\frac{\delta V_o}{\delta I_{17}} = 1/2 \ \{\lambda_{15} \ V_{t15} \ \alpha_{15} - \lambda_{21} \ (V_o - V_{T21})\}^{-1}$$

where $\alpha_{15} = 0.5K \ (V_o - V_{sub} + \psi)^{-.5}$.
Using $$\frac{\delta V_o}{\delta V_{in}} = \frac{\delta V_o}{\delta I_{17}} \cdot \frac{\delta I_{17}}{\delta V_{in}} = Av$$

which factored and rearranged is $$Av = \frac{G}{\alpha_{15} - \frac{\lambda_{21}}{\lambda_{15}} \ ( \frac{V_o - V_{T21}}{V_{t15}})} \cdot \frac{G \cdot V_{in} - V_{t15}}{G \cdot V_{in} - 2V_{t15}}$$

the voltage gain of the FIG. 3 circuit. This can be simplified as $$Av = \frac{G}{\alpha_{15}(V_{in}) - Y \ (V_{in})} \cdot \{X \ (V_{in})\}$$

where the notation implies that $\alpha_{15}$, Y, and X are functions of $V_{in}$.

The behavior of these factors with respect to $V_{in}$ is plotted in the lower three graphs where it may be seen that for X and $\alpha_{15}$, the Av increases with increasing $V_{in}$ but a change in Y is a direction to compensate for changes in $V_{in}$ due to X and $\alpha_{15}$. The slope of Y may be determined by a selection of the ratio $\lambda_{21}/\lambda_{15}$ so that a desired variation (normally zero) of the circuit gain with respect to the input voltage signal may be achieved.

The following approximation may be used to select the $\lambda_{21}/\lambda_{15}$ ratio.

$$Av_{(V_{in} = 0)} = \frac{G/2}{\alpha_{15} - (\frac{\lambda_{21}}{\lambda_{15}}) \ (\frac{V_o - V_{T21}}{V_{t15}})}$$

and where the second numerator term is smaller than $\alpha_{15}$ $$Av_{(V_{in} = 0)} \cong \frac{G}{2(\alpha_{15})} \text{ so that}$$

$$\frac{\lambda_{21}}{\lambda_{15}} \cong (\alpha_{15})^2 \ \{1 - \frac{V_{t15}}{2(\alpha_{15}) \ (V_o - V_{sub}) \ \psi}\}$$

It can therefor be seen that by an appropriate selection of the characteristics of the two shunting FETs 20 and 21 as compared to the characteristics of FETs 10 and 15, the gain of the circuit may be controlled to be uniform over the operating range of the amplifier.

The above embodiment is intended to be illustrative of the best embodiment of the invention and is not to be taken as limiting the scope of the invention as set out in the following claims.

What is claimed is:
1. A constant gain differential amplifier circuit for integrated circuit use, said circuit comprising:
   a semi-conductive substrate;
   a source of voltage having a drain supply terminal and a source supply terminal;
   a pair of depletion type transistors deposited in said substrate and having their drain electrodes connected to said drain supply;
   a pair of enhancement type transistors also deposited in said substrate, and each having its drain connected to the source and gate of an associated one of said depletion type transistors;
   a connection from the gate of one of said enhancement type transistors to a source of a reference voltage;

a connection from the gate of the other of said enhancement type transistors to an input signal voltage to be amplified;

a constant current control interposed between said source supply terminal and the sources of both said enhancement type transistors; and a gain control transistor for each pair of associated depletion-enhancement type transistors, each said gain control transistor having its drain and its gate connected to the source-drain junction of its associated pair of transistors and its source connected to said reference voltage source.

2. An amplifier circuit as set out in claim 1, in which:

each said gain control transistor is of the enhancement type and is of such proportion as to conduct only a comparatively small portion of the current passing through its associated depletion type transistor.

3. In a constant gain differential amplifier circuit;

a constant current supply circuit having a drain terminal and a source terminal and including a current control device;

a pair of depletion type field effect transistors, each having its drain connected to said drain terminal and its gate connected to its source;

a pair of enhancement type field effect transistors, each having its source connected to said source terminal;

a connection between the source of one of said depletion type transistors and the drain of one of said enhancement type transistors;

a third enhancement type transistor having its gate and its drain connected to said connection and its source connected to a reference voltage;

a second connection between the source of the other of said depletion type transistors and the drain of the other of said enhancement type transistors;

a fourth enhancement type transistor having its gate and its drain connected to said second connection and its source connected to said reference voltage;

a conductor connecting the gate of said one of said enhancement type transistors to an input signal voltage to be amplified;

a conductor connecting the gate of said other of said enhancement type transistors to said reference voltage; and an output signal conductor connected to said drain of said other enhancement type transistor.

4. A constant gain differential amplifier as set out in claim 3, in which said third and said fourth enhancement type transistors conduct only a small but a significant part of the current passing through said connected depletion type transistor to substantially eliminate any variation in the gain of said amplifier as the voltage of said input signal is varied.

* * * * *